(12) United States Patent
Park (10) Patent No.: US 9,372,415 B2
(45) Date of Patent: Jun. 21, 2016

(54) APPARATUS FOR REMOVING SOLVENT AND PHOTOLITHOGRAPHY APPARATUS USING THE SAME

(71) Applicant: Samsung Display Co., Ltd., Yongin, Gyeonggi-Do (KR)

(72) Inventor: Jae Eun Park, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 342 days.

(21) Appl. No.: 14/037,197

(22) Filed: Sep. 25, 2013

(65) Prior Publication Data

US 2014/0185023 A1    Jul. 3, 2014

(30) Foreign Application Priority Data

Dec. 27, 2012 (KR) .................. 10-2012-0155069

(51) Int. Cl.
*G03F 7/20* (2006.01)
*G03F 7/16* (2006.01)

(52) U.S. Cl.
CPC ............ *G03F 7/70925* (2013.01); *G03F 7/168* (2013.01); *Y10T 137/85978* (2015.04)

(58) Field of Classification Search
None
See application file for complete search history.

(56) References Cited

U.S. PATENT DOCUMENTS

| | | |
|---|---|---|
| 2003/0211756 A1 | 11/2003 | Ito et al. |
| 2004/0091618 A1 | 5/2004 | Park et al. |
| 2008/0252865 A1* | 10/2008 | Nagasaka ............ G03F 7/70341 355/30 |
| 2009/0061331 A1* | 3/2009 | Nakano ................ G03F 7/70341 430/30 |
| 2009/0066922 A1* | 3/2009 | Nakano ................ G03F 7/70925 355/30 |
| 2009/0103064 A1* | 4/2009 | Yoda ................... G03F 7/70341 355/30 |
| 2009/0109413 A1* | 4/2009 | Shibazaki ........... G03F 7/70925 355/30 |
| 2009/0117499 A1* | 5/2009 | Kim .................... G03F 7/70925 430/326 |
| 2011/0134400 A1* | 6/2011 | Shibazaki ........... G03F 7/70341 355/30 |

FOREIGN PATENT DOCUMENTS

| | | |
|---|---|---|
| JP | 2003-234278 A | 8/2003 |
| KR | 10-2002-0066248 A | 8/2002 |
| KR | 10-2010-0127056 A | 12/2010 |

* cited by examiner

*Primary Examiner* — Dah-Wei D Yuan
*Assistant Examiner* — Jethro M Pence
(74) *Attorney, Agent, or Firm* — Knobbe Martens Olson & Bear LLP (57) ABSTRACT

A solvent removing apparatus is disclosed. One aspect includes a chamber, a first pump, a silencer, a valve, and a discharge unit. The chamber dries a coating layer formed on a substrate. The first pump intakes a solvent evaporated from the coating layer of the chamber and discharges the inhaled solvent. The silencer reduces discharge noise of the first pump and accommodates a liquefied solvent of the evaporated solvent provided from the first pump. The valve discharges the liquefied solvent accommodated in the silencer. The discharge unit discharges the evaporated solvent provided by the silencer.

6 Claims, 6 Drawing Sheets

APPARATUS FOR REMOVING SOLVENT AND PHOTOLITHOGRAPHY APPARATUS USING THE SAME

CROSS-REFERENCE TO RELATED APPLICATIONS

This U.S. non-provisional patent application claims priority under 35 U.S.C. §119 of Korean Patent Application No. 10-2012-0155069, filed on Dec. 27, 2012, the contents of which are hereby incorporated by reference.

BACKGROUND

1. Field

The disclosed technology relates to an apparatus for removing a solvent and a photolithography apparatus using the removing apparatus.

2. Description of the Related Technology

A display device or a semiconductor device includes patterns disposed on a substrate. The patterns include electrodes, wirings, semiconductor channels, and the like. These patterns are formed by using a photolithography process.

Photolithography processes include a process for removing a solvent contained in a photoresist. The process of solvent removal is performed by using a solvent removing apparatus. When radiant heat is applied to a substrate loaded into a chamber, the solvent in the photoresist evaporates and the evaporated solvent is discharged to the environment outside of the chamber.

The evaporated solvent is partially liquefied while being discharged and the liquefied solvent blocks a discharge path through which the evaporated solvent is discharged. As a result, the solvent removing apparatus malfunctions.

SUMMARY OF CERTAIN INVENTIVE ASPECTS

The disclosed technology includes a solvent removing apparatus capable of efficiently removing a solvent.

The disclosed technology also includes a photolithography apparatus having the solvent removing apparatus.

An aspect of the inventive concept includes a solvent removing apparatus, comprising a chamber, a first pump, a silencer, a valve, and a discharge unit. The chamber configured to dry a coating layer formed on a substrate. The first pump configured to intake a solvent evaporated from the coating layer of the chamber and discharges the evaporated solvent. The silencer configured to reduce discharge noise of the first pump and accommodates a liquefied solvent of the evaporated solvent provided from the first pump. The valve configured to discharge the liquefied solvent accommodated in the silencer. The discharge unit configured to discharge the evaporated solvent provided from the silencer.

In embodiments, the substrate is used as a portion of a display panel, and the coating layer is a photoresist.

The chamber comprises an outer wall, a stage accommodated in the outer wall to support the substrate, and a heat source disposed to face the stage and provide radiant heat to the coating layer.

The discharge unit comprises a filter configured to remove foreign substance contained in the evaporated solvent provided from the silencer and a discharge pipe configured to guide the evaporated solvent, which passes through the filter, to the outside thereof.

The solvent removing apparatus further includes a second pump connected to the silencer, and the second pump intakes the liquefied solvent accommodated in the silencer and discharges the intaked solvent when the valve is opened.

Another aspect of the inventive concept includes a photolithography apparatus including a cleaning part configured to clean a substrate, a photoresist forming configured to dry a photoresist on the substrate, a solvent removing part configured to dry the photoresist so as to remove a solvent contained in the photoresist, an exposing part configured to expose the dried photoresist, and a developing part configured to develop the exposed photoresist. The solvent removing part comprising: the chamber, the first pump, the silencer, the valve, and the discharge unit.

In embodiments, the photolithography apparatus further comprising a transfer part configured to transfer the substrate to the developing part from the cleaning part through the photoresist forming part, the solvent removing part, and the exposing part.

According to the above, the liquefied solvent accumulated in the silencer is discharged from the silencer, and thus the discharge path through which the liquefied solvent passes is substantially unobstructed. Thus, the solvent removing apparatus can be normally operated and maintained.

In addition, since the solvent removing apparatus normally operates as a part of the photolithography apparatus, the photolithography process can be made more efficient.

BRIEF DESCRIPTION OF THE DRAWINGS

The above and other advantages of the disclosed technology will become readily apparent by reference to the following detailed description when considered in conjunction with the accompanying drawings wherein.

DETAILED DESCRIPTION OF CERTAIN INVENTIVE EMBODIMENTS

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosed technology will be explained in detail with reference to the accompanying drawings.

Figure 1:
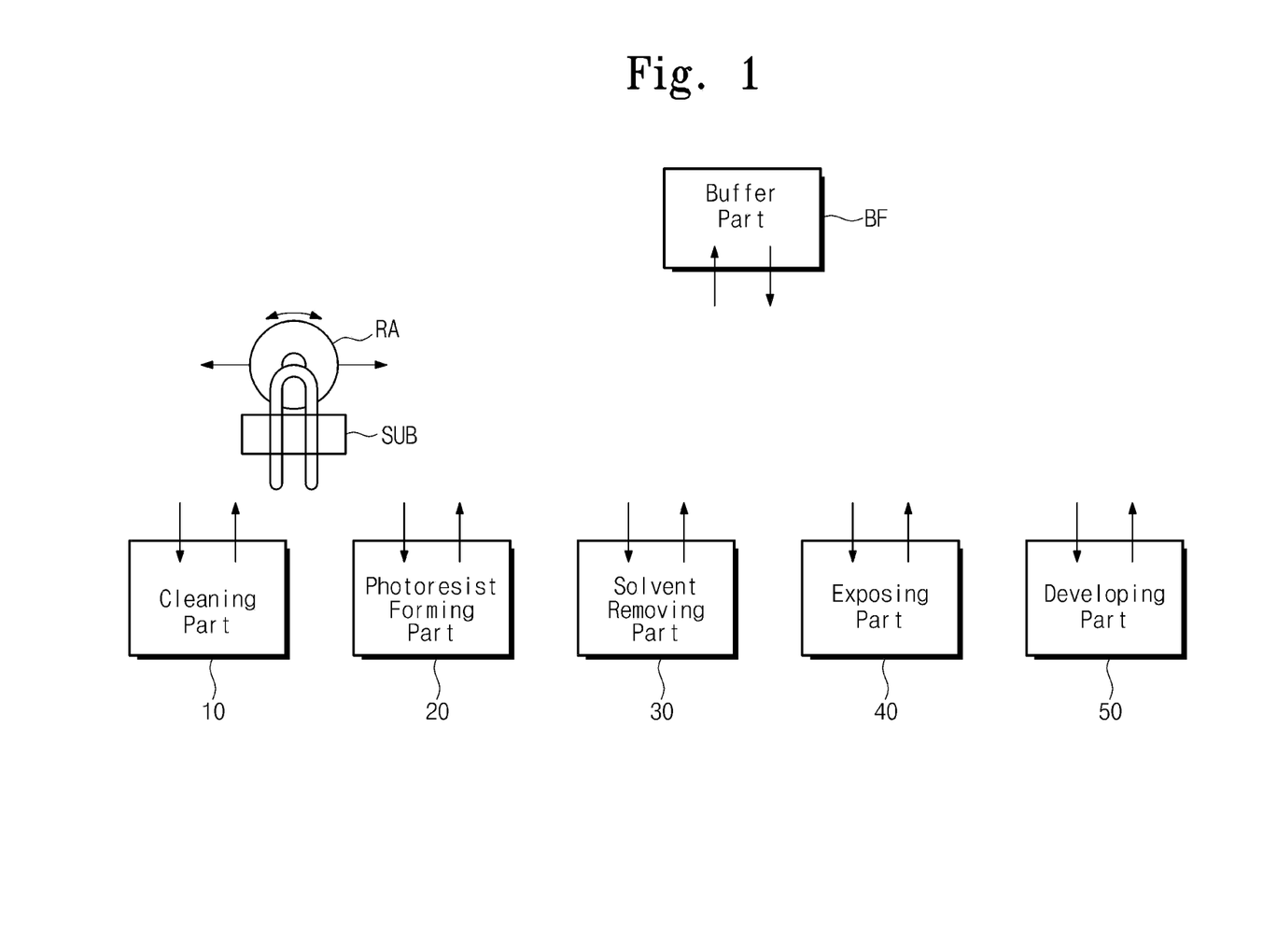
FIG. 1 is a block diagram showing a photolithography apparatus according to an exemplary embodiment of the disclosed technology.
Figure 2:
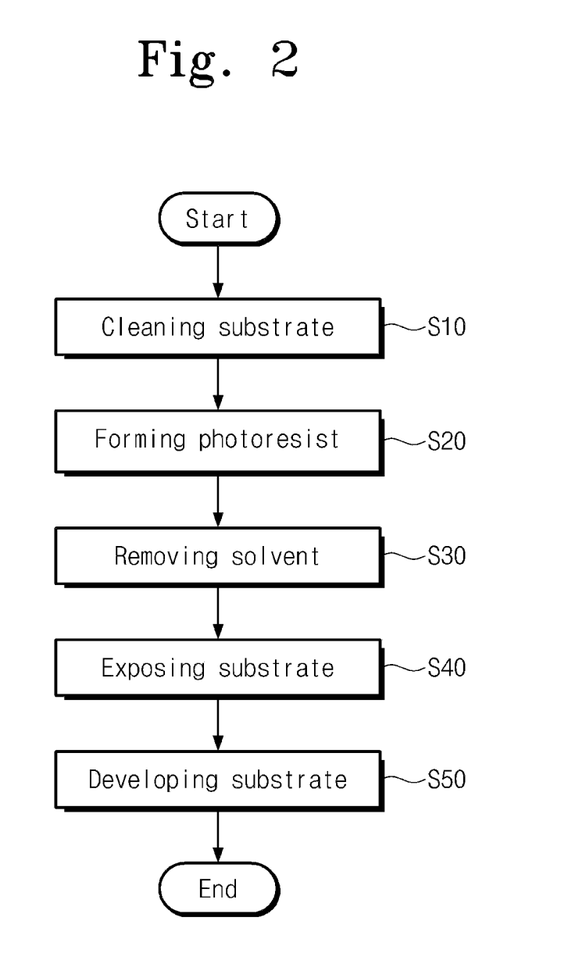
FIG. 2 is a flowchart showing a photolithography process.

FIG. 1 is a block diagram showing a photolithography apparatus according to an exemplary embodiment of the disclosed technology and FIG. 2 is a flowchart showing a representative photolithography process.

Referring to FIG. 1, the photolithography apparatus includes a cleaning part 10, a photoresist forming part 20, a solvent removing part 30, an exposing part 40, and a developing part 50. In addition, the photolithography apparatus includes buffer parts respectively disposed between the cleaning part 10, the photoresist forming part 20, the solvent removing part 30, the exposing part 40, and the developing part 50. In FIG. 1, a buffer part BF disposed between the solvent removing part 30 and the exposing part 40 has been shown as an example.

The photolithography apparatus further includes a transfer part RA to transfer a substrate SUB. The transfer part RA transfers the substrate SUB to the photoresist forming part 20, the solvent removing part 30, and the exposing part 40 from the cleaning part 10.

The transfer part RA carries the substrate SUB to or carries the substrate SUB from the cleaning part 10, the photoresist forming part 20, the solvent removing part 30, the exposing part 40, and the developing part 50. The transfer part RA includes a robot arm or a conveyer belt.

Referring to FIG. 2, the typical photolithography process includes steps of cleaning (S10), forming a photoresist (S20), removing a solvent from the photoresist (S30), exposing (S40), and developing (S50).

The cleaning process (S10) is performed by the cleaning part 10. The substrate SUB provided to the cleaning part 10 is used as a part of a display panel or a semiconductor device such as an integrated circuit or a motherboard containing multiple panels/devices. The substrate SUB provided to the cleaning part 10 may include a metal layer or a semiconductor layer, which is formed in a previously performed process. The substrate SUB cleaned by the cleaning part 10 is carried from the cleaning part 10 by the transfer part RA.

The photoresist forming process (S20) is performed by the photoresist forming part 20. To this end, a photoresist is coated on a surface of the substrate SUB. For instance, the photoresist is formed on the metal layer or the semiconductor layer using a screen coating method, a roll coating method, a spin coating method, or an inkjet coating method. The substrate SUB on which the photoresist is formed is carried out from the photoresist forming part 20 by the transfer part RA.

The solvent removing process S30 is performed by the solvent removing part 30. Radiant heat is applied to the surface of the substrate SUB to cure or dry the photoresist formed on the surface of the substrate SUB. The solvent contained in the photoresist is evaporated during the curing or drying process. The evaporated solvent is discharged to the environment outside of the solvent removing part 30. The substrate SUB is carried from the solvent removing process S30 by the transfer part RA after the photoresist is dried.

The substrate SUB, from which the solvent is removed by the solvent removing part 30, is transferred to the buffer part BF before the substrate SUB is carried in the exposing part 40. The substrate SUB is cooled in the buffer part BF.

The exposing process S40 is performed by the exposing part 40. ultraviolet light is irradiated onto the photoresist after a master film is attached to the photoresist. The photoresist is partially exposed to the ultraviolet light due to an image pattern formed on the master film. To this end, the master film includes an area that transmits the ultraviolet light (openings) and an area that blocks the ultraviolet light. The exposed substrate SUB is carried from the exposing part 40 by the transfer part RA.

The developing process S50 is performed by the developing part 50. The master film is removed and the portion of the photoresist is dissolved by a developing solution. As the developing solution, a sodium carbonate solution or a potassium carbonate solution may be used. In addition, an exposed portion or an unexposed portion of the photoresist may be dissolved. For instance, when the photoresist is a positive photoresist, the exposed portion of the photoresist is dissolved by the developing solution, and when the photoresist is a negative photoresist, the unexposed portion of the photoresist is dissolved by the developing solution. The developed substrate SUB is carried from the developing part 50 by the transfer part RA.

After the photolithography process, an etch process may be further performed. As a result of the etch process, electrodes, wirings, and semiconductor patterns are formed.

Hereinafter, a configuration of the solvent removing part (hereinafter, referred to as a solvent removing apparatus) and a discharging process of the evaporated solvent will be described in detail with reference to FIGS. 3, 4, and 5. It will be understood by skilled technologists that the solvent removing apparatus according to the present exemplary embodiment should not be limited to a photolithography apparatus.

The solvent removing apparatus may be used for various processes that coat a liquid material and dry the liquid material.

Figure 3:
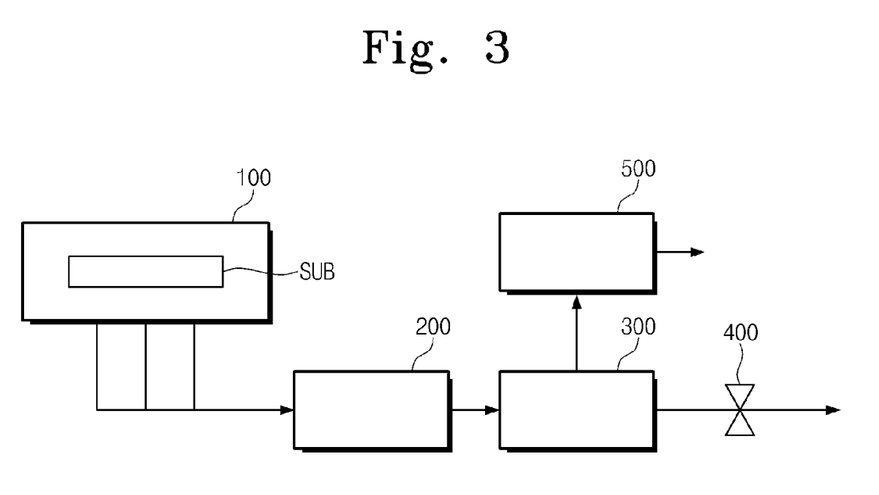
FIG. 3 is a block diagram showing a solvent removing apparatus shown in FIG. 1.
Figure 4:
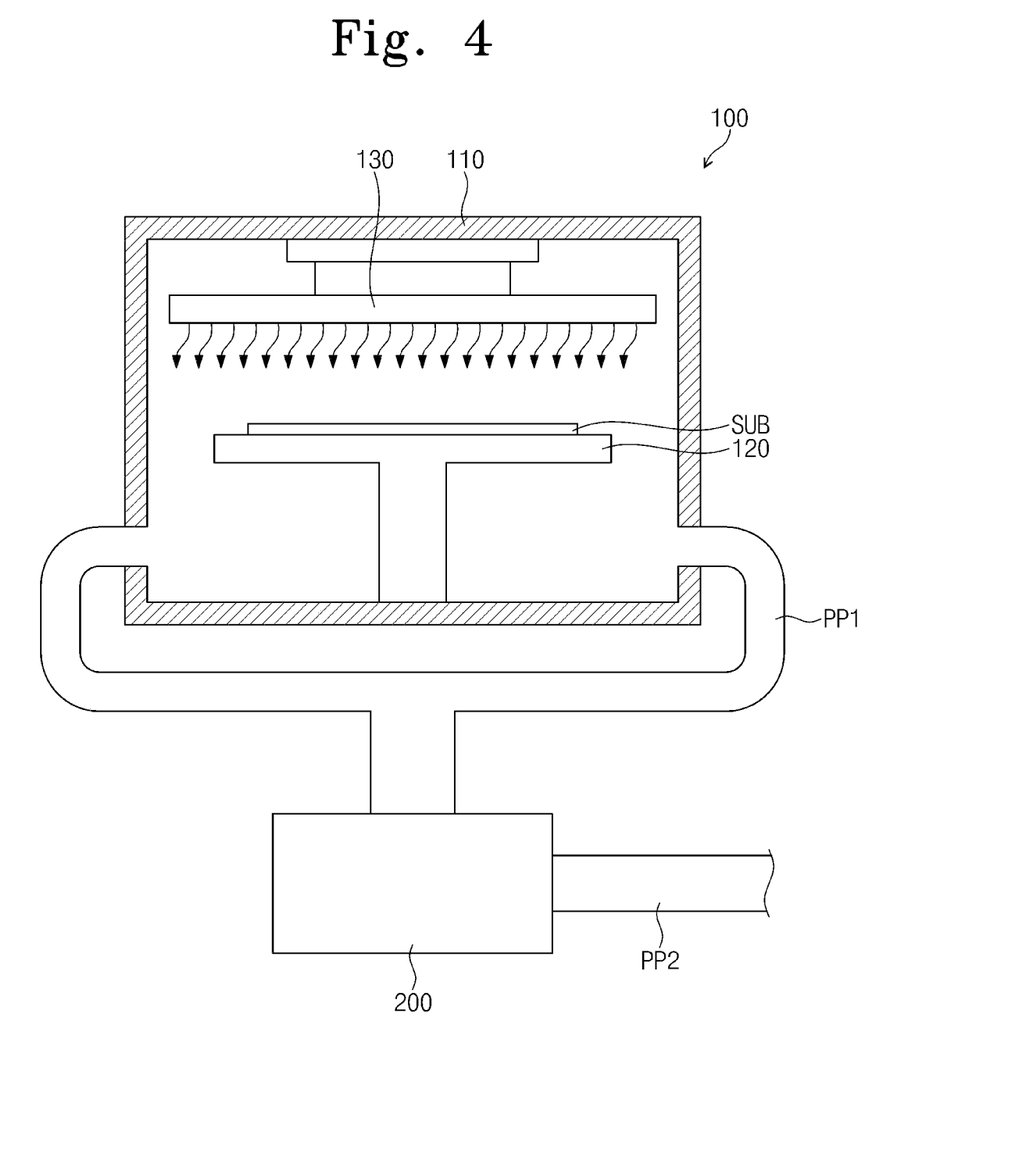
FIG. 4 is a cross-sectional view showing a portion of a solvent removing apparatus according to an exemplary embodiment of the disclosed technology.
Figure 5:
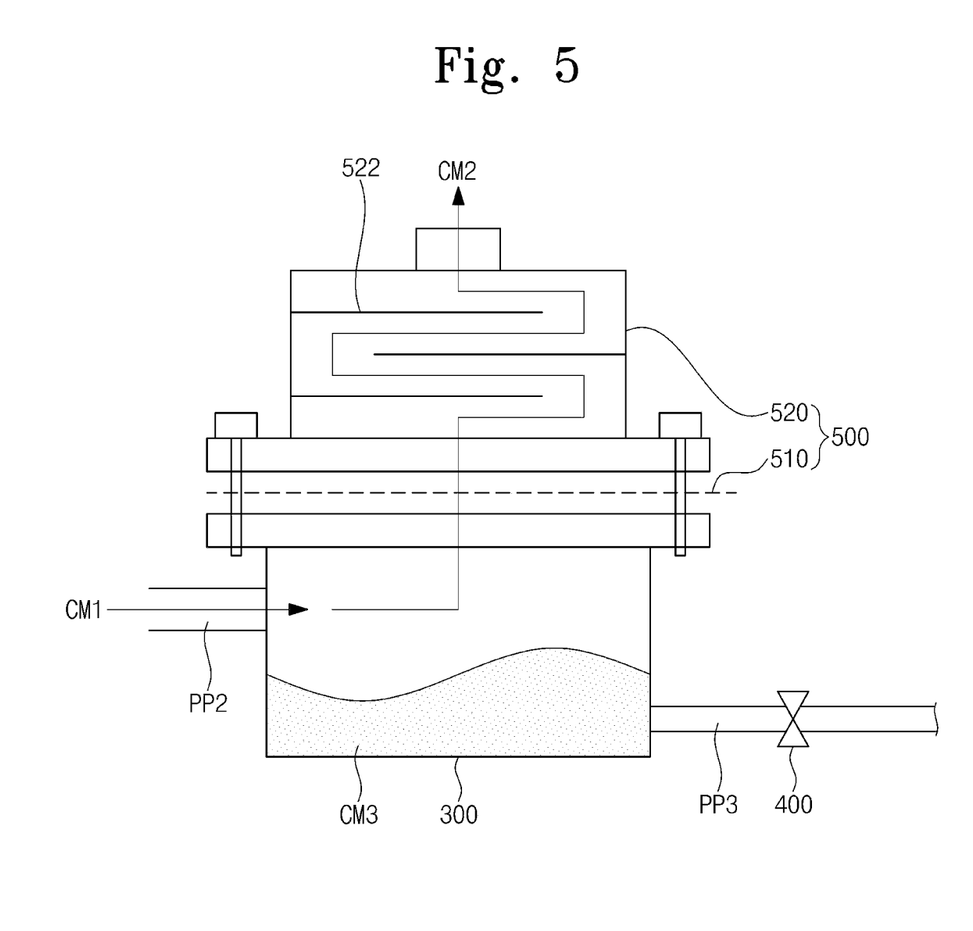
FIG. 5 is a cross-sectional view showing another portion of a solvent removing apparatus according to an exemplary embodiment of the disclosed technology.

FIG. 3 is a block diagram showing a solvent removing apparatus shown in FIG. 1, FIG. 4 is a cross-sectional view showing a portion of a solvent removing apparatus according to an exemplary embodiment of the disclosed technology, and FIG. 5 is a cross-sectional view showing another portion of a solvent removing apparatus according to an exemplary embodiment of the disclosed technology.

Referring to FIG. 3, the solvent removing apparatus includes a chamber 100, a first pump 200, a silencer 300, a valve 400, and a discharge unit 500.

As shown in FIGS. 3 and 4, the chamber 100 includes an outer wall 110, a stage 120 accommodated in the outer wall 110, and a heat source 130. The stage 120 supports the substrate SUB on which a coating layer is formed. The coating layer is formed of the liquid photoresist. The heat source 130 is disposed to face the stage 120 and provides the radiant heat to the coating layer. The heat source 130 may be, but is not limited to, a radiant heat plate. The solvent contained in the coating layer is evaporated by the radiant heat.

The first pump 200 intakes the evaporated solvent and discharges the evaporated solvent to the environment outside of the chamber 100. The first pump 200 and the chamber 100 are connected to each other by a first pipe PP1. The first pump 200 is a dry vacuum pump, for example.

Referring to FIGS. 3 and 4, the silencer 300 is connected to the first pump 200 through a second pipe PP2. The silencer 300 reduces the noise of the first pump 200 as it discharges the evaporated solvent. The silencer 300 may be one of an absorbing type, an interfering type, an expanding type, or a resonating type, for instance.

A solvent CM2, which corresponds to a portion of the evaporated solvent CM1 provided to the silencer 300, is discharged to the environment outside through the discharge unit 500, and a solvent CM3, which corresponds to the other portion of the evaporated solvent CM1 provided to the silencer 300, is liquefied again. The liquefied solvent is accumulated in the silencer 300.

The valve 400 discharges the solvent CM3, which is liquefied, to the environment outside of the silencer 300. The valve 400 is installed in a third pump PP3 connected to the silencer 300.

When the first pump 200 is in operation, the valve 400 is closed to allow for normal operation of the silencer 300. When the first pump 200 is not in operation, the valve 400 is opened to discharge the solvent CM3 that is liquefied. However, the valve 400 may be temporarily opened when the first pump 200 is operated.

As described above, since the solvent CM3, which is liquefied, is periodically discharged from the silencer 300, the discharge path for the evaporated solvent CM2 is secured. In other words, the silencer 300 operates normally and the discharge path for the evaporated solvent CM2 is secured between the first pump 200 and the discharge unit 500.

The discharge unit 500 includes a filter 510 and a discharge pipe 520. The filter 510 removes foreign substances contained in the evaporated solvent CM2. Accordingly, the foreign substances are prevented from accumulating in the discharge pipe 520.

The discharge pipe 520 guides the evaporated solvent CM2 passing through the filter 510. The evaporated solvent CM2 is discharged to the environment outside of the solvent removing apparatus through the discharge pipe 520. The discharge pipe 520 includes boundary walls 522 to elongate the discharge path. The boundary walls 522 are coupled to an inner wall of the discharge pipe 520. The boundary walls 522 have a plate-like shape, and extend in the diameter direction of the discharge pipe 520.

Figure 6:
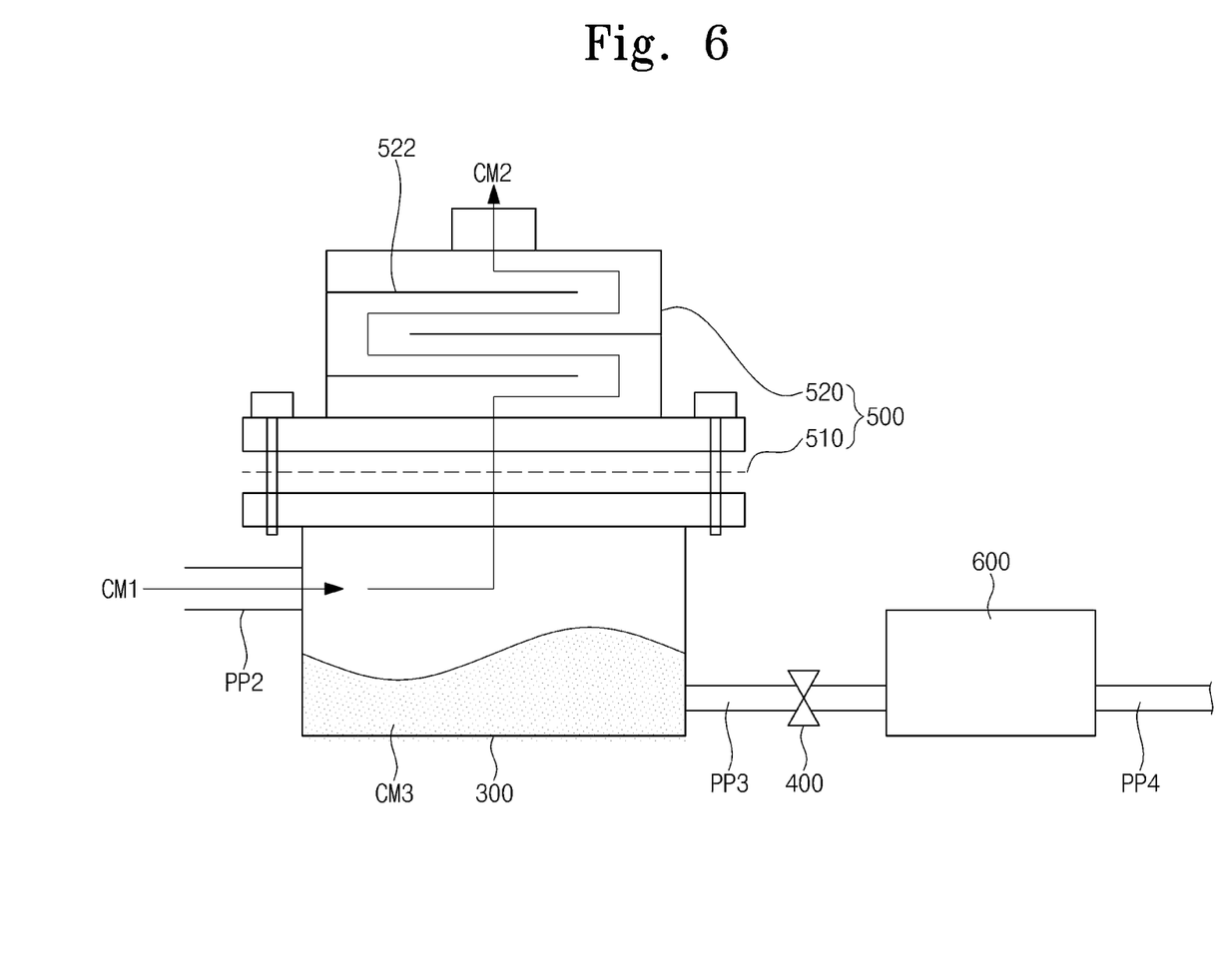
FIG. 6 is a cross-sectional view showing another portion of a solvent removing apparatus according to an exemplary embodiment of the disclosed technology.

FIG. 6 is a cross-sectional view showing another portion of a solvent removing apparatus according to an exemplary embodiment of the disclosed technology. In FIG. 6, the same reference numerals denote the same elements in FIGS. 4 and 5, and thus, detailed descriptions of the same elements will be omitted.

Referring to FIG. 6, the solvent removing apparatus further includes a second pump 600. The second pump 600 is connected to the silencer 300 through the third pipe PP3. When the valve 400 is opened, the second pump 600 intakes the liquefied solvent CM3 accumulated in the silencer 300 and discharges the liquefied solvent CM3 to the environment outside of the silencer 300. The second pump 600 rapidly discharges the liquefied and accumulate solvent CM3 to the environment outside of the silencer 300. Thus, the time during which the first pump 200 is not in operation becomes short and the solvent removing apparatus can be rapidly and normally operated.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A photolithography apparatus comprising:
    a cleaning part configured to clean a substrate;
    a photoresist forming part configured to form a photoresist on the substrate;
    a solvent removing part configured to dry the photoresist so as to remove a solvent contained in the photoresist;
    an exposing part configured to expose the dried photoresist; and
    a developing part configured to develop the exposed photoresist, the solvent removing part comprising:
        a chamber configured to dry the photoresist formed on a substrate;
        a first pump configured to intake an evaporated solvent from the chamber and discharge the evaporated solvent, wherein the evaporated solvent is evaporated from the photoresist;
        a silencer configured to reduce discharge noise of the first pump and accommodate a liquefied solvent of the evaporated solvent provided from the first pump;
        a valve configured to discharge the liquefied solvent accommodated in the silencer; and
        a discharge unit configured to discharge the evaporated solvent provided from the silencer.

2. The photolithography apparatus of claim 1, wherein the substrate is used as a portion of a display panel.

3. The photolithography apparatus of claim 1, further comprising a transfer part configured to transfer the substrate to the developing part from the cleaning part through the photoresist forming part, the solvent removing part, and the exposing part.

4. The photolithography apparatus of claim 1, wherein the chamber comprises:
    an outer wall;
    a stage accommodated in the outer wall to support the substrate; and
    a heat source disposed to face the stage and provide radiant heat to the photoresist.

5. The photolithography apparatus of claim 1, wherein the discharge unit comprises:

a filter configured to remove foreign substances contained in the evaporated solvent provided from the silencer; and a discharge pipe that guides the evaporated solvent, which passes through the filter, to the outside thereof.

6. The photolithography apparatus of claim 1, further comprising a second pump connected to the silencer, wherein the second pump intakes the liquefied solvent accommodated in the silencer and discharges the intaked solvent when the valve is opened.

* * * * *